(12) United States Patent
Fukuda

(10) Patent No.: US 9,412,777 B2
(45) Date of Patent: Aug. 9, 2016

(54) IMAGE SENSOR AND IMAGE CAPTURING APPARATUS FOR SATISFACTORY PUPIL DIVISION BY A FOCUS DETECTION PIXEL IN WHICH A LIGHT GUIDE IS FORMED

(71) Applicant: CANON KABUSHIKI KAISHA, Tokyo (JP)

(72) Inventor: Koichi Fukuda, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 240 days.

(21) Appl. No.: 14/030,321

(22) Filed: Sep. 18, 2013

(65) Prior Publication Data

US 2014/0111677 A1   Apr. 24, 2014

(30) Foreign Application Priority Data

Oct. 19, 2012 (JP) ................................. 2012-232333
Aug. 19, 2013 (JP) ................................. 2013-169927

(51) Int. Cl.
| | |
|---|---|
| *H01L 27/146* | (2006.01) |
| *H04N 5/232* | (2006.01) |
| *H04N 5/225* | (2006.01) |
| *H04N 5/369* | (2011.01) |

(52) U.S. Cl.
CPC .... *H01L 27/14629* (2013.01); *H01L 27/14625* (2013.01); *H04N 5/2254* (2013.01); *H04N 5/23212* (2013.01); *H04N 5/3696* (2013.01)

(58) Field of Classification Search
CPC ............................ H01L 27/14629; H04N 5/30
USPC ........................................................... 348/332
See application file for complete search history.

(56) References Cited

U.S. PATENT DOCUMENTS

| | | | |
|---|---|---|---|
| 4,410,804 A | 10/1983 | Stauffer | |
| 7,615,732 B2 * | 11/2009 | Tani .................. | H01L 27/14625 250/214.1 |
| 2008/0079031 A1 * | 4/2008 | Tani .............................. | 257/225 |
| 2008/0258250 A1 * | 10/2008 | Uenishi ......................... | 257/432 |
| 2009/0136174 A1 * | 5/2009 | Itahashi ............ | H01L 27/14625 385/14 |
| 2011/0121422 A1 * | 5/2011 | Saitou et al. ................... | 257/432 |
| 2012/0133809 A1 * | 5/2012 | Yamada ......................... | 348/294 |
| 2012/0199725 A1 * | 8/2012 | Shimotsusa et al. ........ | 250/208.1 |
| 2012/0200727 A1 * | 8/2012 | Kato et al. .................. | 348/222.1 |
| 2013/0038691 A1 * | 2/2013 | Agranov ............ | H04N 13/0228 348/46 |

* cited by examiner

*Primary Examiner* — Twyler Haskins
*Assistant Examiner* — Akshay Trehan
(74) *Attorney, Agent, or Firm* — Cowan, Liebowitz & Latman, P.C.

(57) ABSTRACT

An image capturing apparatus comprises an image sensor including a plurality of image forming pixels and a lens which is arranged for the plurality of image forming pixels. Each of the image forming pixels includes a plurality of divided photo-electric conversion units, and the plurality of photo-electric conversion units have a function of photo-electrically converting a plurality of images having passed through different exit pupils of the imaging optical system, and outputting focus detection signals. Each of the image forming pixels includes a first light guide and a second light guide. The first light guide is arranged on a side of the lens, and the second light guide is arranged on a side of the photo-electric conversion unit, and a division count of the second light guide is larger than the division count of the first light guide.

6 Claims, 10 Drawing Sheets

IMAGE SENSOR AND IMAGE CAPTURING APPARATUS FOR SATISFACTORY PUPIL DIVISION BY A FOCUS DETECTION PIXEL IN WHICH A LIGHT GUIDE IS FORMED

BACKGROUND OF THE INVENTION

1. Field of the Invention

The present invention relates to an image sensor and an image capturing apparatus using it.

2. Description of the Related Art

There is proposed an image capturing apparatus which performs focus detection by, as a method for detecting the focus state of a photographing lens, a pupil division phase-difference method (imaging plane phase-difference method) using a two-dimensional image sensor in which a microlens is formed in each pixel.

U.S. Pat. No. 4,410,804 discloses an image capturing apparatus using a two-dimensional image sensor in which one microlens and a plurality of divided photo-electric conversion units are formed for one pixel. The divided photo-electric conversion units are configured to receive beams having passed through different areas of the exit pupil of a photographing lens through one microlens, thereby achieving pupil division. Focus detection is performed by obtaining an image shift amount from signals of the beams received by the divided photo-electric conversion units. An imaging signal is acquired by adding the signals of the beams received by the divided photo-electric conversion units. In addition to focus detection, U.S. Pat. No. 4,410,804 discloses that a stereoscopic image can be provided by separately displaying, for the right and left eyes, parallax signals of beams received by right and left divided photo-electric conversion units in each pixel.

In focus detection by the pupil division phase-difference method using the two-dimensional image sensor, the focus detection accuracy greatly depends on the pupil intensity distribution (pupil division performance) of focus detection pixels. High-accuracy focus detection can be implemented by setting a high peak intensity of the pupil intensity distribution of focus detection pixels and setting a narrow half-value width.

However, if a light guide is formed between the microlens and a plurality of divided photo-electric conversion units to increase the light receiving efficiency at a small pixel size of the image sensor, this impairs the pupil division performance.

SUMMARY OF THE INVENTION

The present invention has been made to solve the above-described problems, and enables satisfactory pupil division in an image sensor including focus detection pixels in each of which a light guide is formed.

According to the first aspect of the present invention, there is provided an image capturing apparatus comprising an image sensor including a plurality of image forming pixels which detect an object image formed by an imaging optical system and generate a captured image, and a lens which is arranged for the plurality of image forming pixels and converges incident light to the image forming pixels, wherein each of the image forming pixels includes a plurality of divided photo-electric conversion units, the plurality of photo-electric conversion units have a function of photo-electrically converting a plurality of images having passed through different exit pupils of the imaging optical system, and outputting focus detection signals for performing focus adjustment by a phase-difference detection method, each of the image forming pixels includes a first light guide and a second light guide between the lens and the plurality of divided photo-electric conversion units, the first light guide is arranged on a side of the lens, and the second light guide is arranged on a side of the photo-electric conversion unit, and a division count of the second light guide is larger than the division count of the first light guide.

According to the second aspect of the present invention, there is provided an image sensor comprising a plurality of image forming pixels each including a lens and a plurality of divided photo-electric conversion units, wherein each of the image forming pixels includes a first light guide and a second light guide between the lens and the plurality of divided photo-electric conversion units, the first light guide is arranged on a side of the lens, the second light guide is arranged on a side of the photo-electric conversion unit, and a division count of the second light guide is larger than the division count of the first light guide.

Further features of the present invention will become apparent from the following description of exemplary embodiments with reference to the attached drawings.

DESCRIPTION OF THE EMBODIMENTS

An embodiment of the present invention will now be described in detail with reference to the accompanying drawings.

Figure 1:
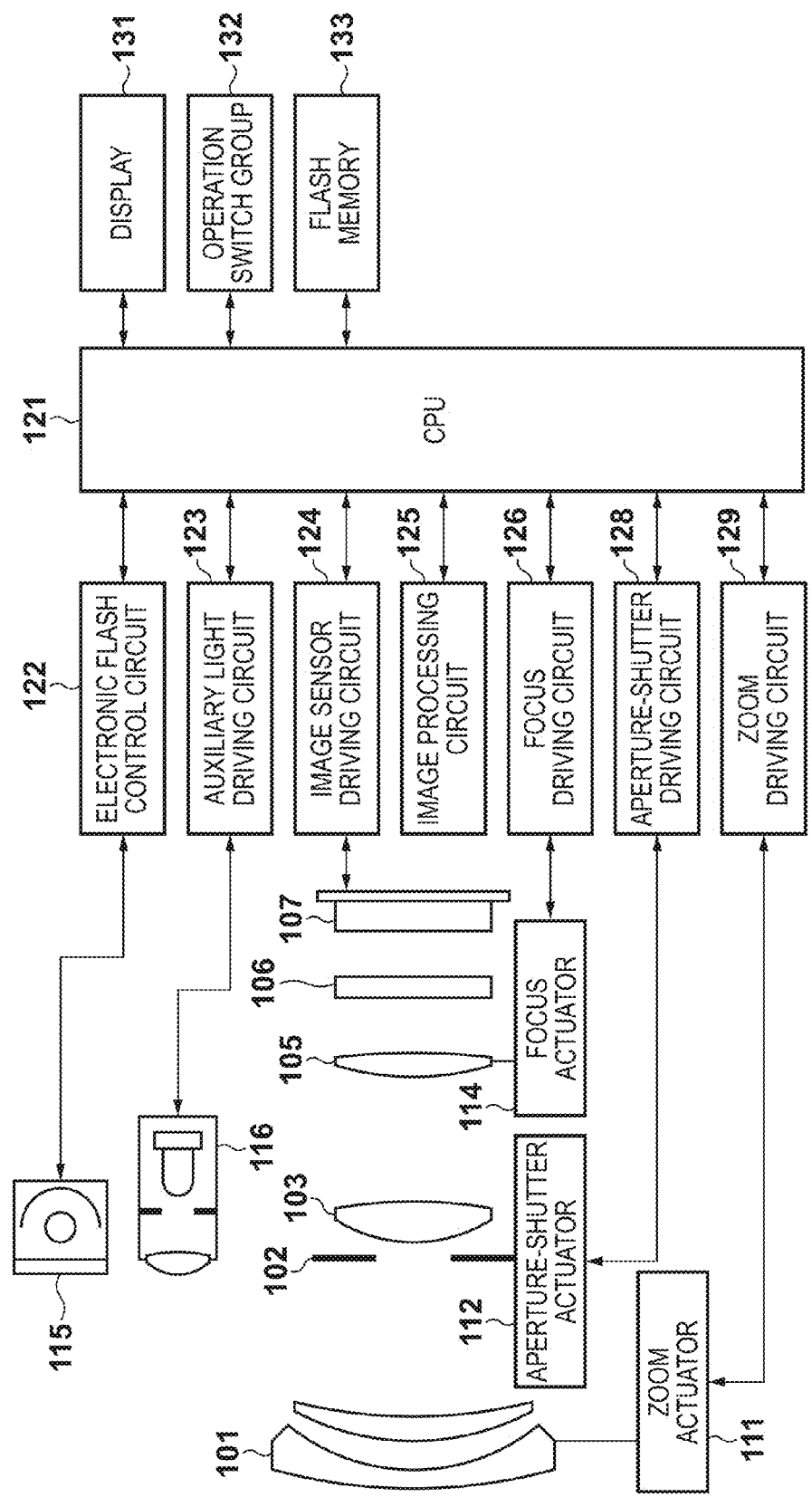
FIG. 1 is a view showing the schematic arrangement of an image capturing apparatus in an embodiment of the present invention.

FIG. 1 is a view showing the arrangement of a camera as an image capturing apparatus including an image sensor according to the embodiment of the present invention. In FIG. 1, a first lens group 101 is arranged at the front end of an imaging optical system, and held to be movable forward and backward along the optical axis. An aperture-shutter 102 adjusts the amount of light during imaging by adjusting its opening diameter, and also functions as an exposure time adjusting shutter during still image capturing. Reference numeral 103 denotes a second lens group. The aperture-shutter 102 and second lens group 103 move together forward and backward along the optical axis, and provide a magnification change effect (a zoom function) in synchronism with the forward/backward movement of the first lens group 101.

A third lens group 105 performs focus adjustment by moving forward and backward along the optical axis. An optical low-pass filter 106 is an optical element for reducing false color and moiré of a captured image. An image sensor 107 is composed of a two-dimensional CMOS photosensor and the surrounding circuit.

A zoom actuator 111 carries out a magnification-change operation by rotating a cam barrel (not shown) to move the first lens group 101 through the third lens group 105 forward and backward along the optical axis. An aperture-shutter actuator 112 controls the opening diameter of the aperture-shutter 102 to adjust the amount of light for imaging, and also controls the exposure time during still image capturing. A focus actuator 114 moves the third lens group 105 forward and backward along the optical axis to adjust the focus.

An electronic flash 115 for illuminating an object is used during imaging. A flash illumination device that uses a Xenon tube is preferable, but an illumination device comprised of a continuous-flash LED may also be used. An AF auxiliary light device 116 projects an image of a mask having a predetermined opening pattern onto the object field through a projection lens to improve focus detection capability for dark objects and low-contrast objects.

A CPU 121 controls the camera main unit in various ways within the camera. The CPU 121 includes a calculation unit, ROM, RAM, A/D converter, D/A converter, and communication interface circuit. Based on predetermined programs stored in the ROM, the CPU 121 drives various circuits of the camera and executes a series of operations such as AF, imaging, image processing, and recording.

An electronic flash control circuit 122 controls ON operation of the electronic flash 115 in synchronism with an imaging operation. An auxiliary light driving circuit 123 controls ON operation of the AF auxiliary light device 116 in synchronism with a focus detection operation. An image sensor driving circuit 124 controls the image sensing operation of the image sensor 107, and also A/D-converts an acquired image signal and transmits the converted image signal to the CPU 121. An image processing circuit 125 performs processes such as γ conversion, color interpolation, and JPEG compression on the image acquired by the image sensor 107.

A focus driving circuit 126 controls driving of the focus actuator 114 based on a focus detection result to drive the third lens group 105 forward and backward along the optical axis, thereby adjusting the focus. An aperture-shutter driving circuit 128 controls driving of the aperture-shutter actuator 112 to control the opening of the aperture-shutter 102. A zoom driving circuit 129 drives the zoom actuator 111 in accordance with a zoom operation by the user.

A display 131 such as an LCD displays information about the imaging mode of the camera, a preview image before imaging, a confirmation image after imaging, a focus state display image during focus detection, and the like. An operation switch group 132 includes a power switch, a release (imaging trigger) switch, a zoom operation switch, and an imaging mode selection switch. A detachable flash memory 133 records captured images.

[Image Sensor]

Figure 2:
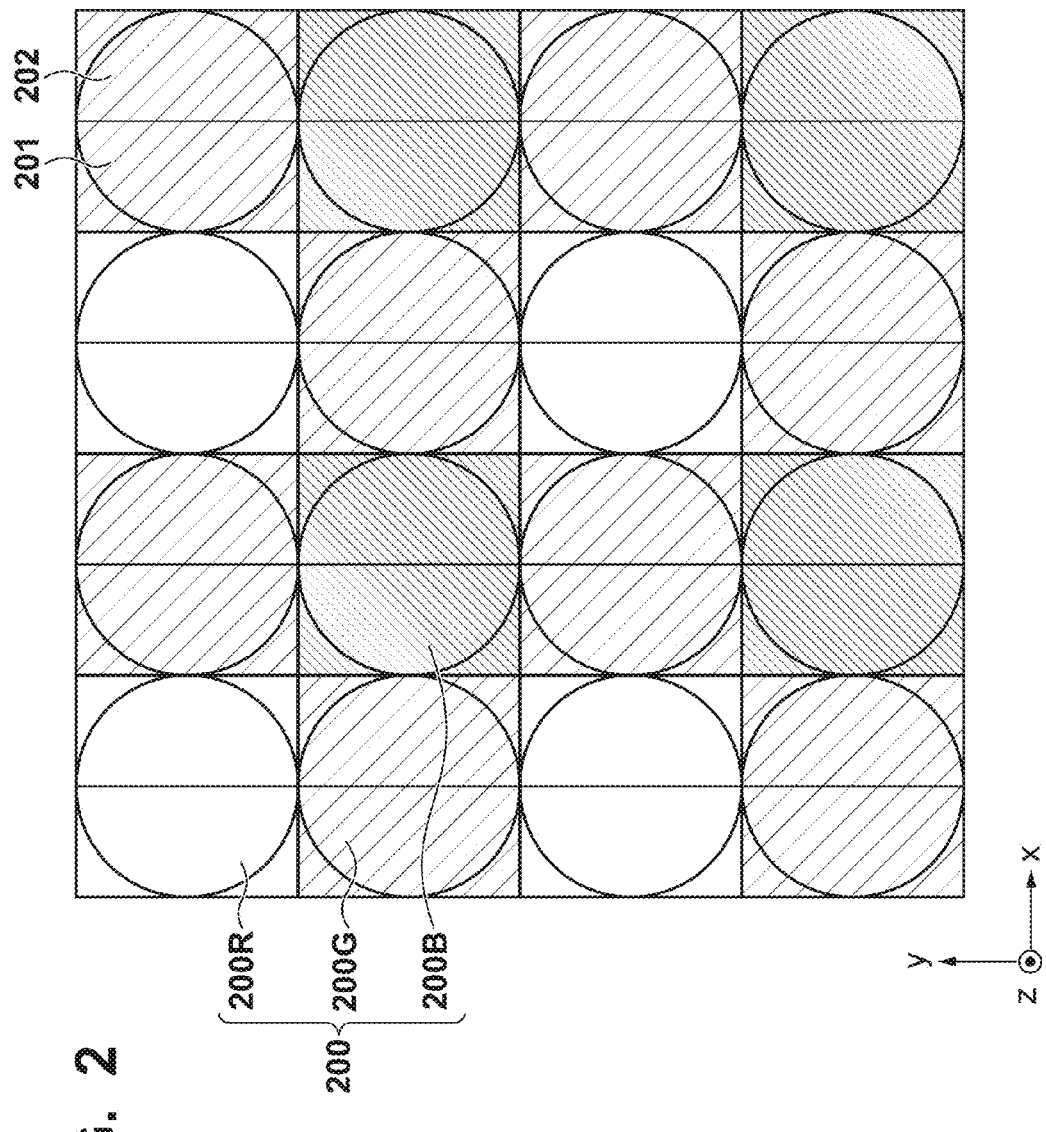
FIG. 2 is a schematic view showing a pixel array in the embodiment of the present invention.

FIG. 2 is a schematic view showing the pixel array of the image sensor in the embodiment. FIG. 2 shows the pixel array of 4×4 pixels in a two-dimensional CMOS sensor (image sensor) according to the embodiment. Many sets each of 4×4 pixels shown in FIG. 2 are arranged on the imaging surface so that a high-resolution image can be acquired. The embodiment will describe an image sensor having a pixel pitch of 2.75 μm, 3600×2400=8,640,000 effective pixels, and a 9.9 mm×6.6 mm imaging surface.

According to the embodiment, in an image forming pixel group 200 of 2×2 pixels shown in FIG. 2, image forming pixels 200G which have G (Green) spectral sensitivity and generate a captured image are arranged as two diagonal pixels. An image forming pixel 200R having R (Red) spectral sensitivity, and an image forming pixel 200B which has B (Blue) spectral sensitivity and generates a captured image are arranged as two other pixels. In each pixel 200G (200R, 200B) shown in FIG. 2, sub-pixels 201 and 202 are arranged in two columns and one row.

Figure 3:
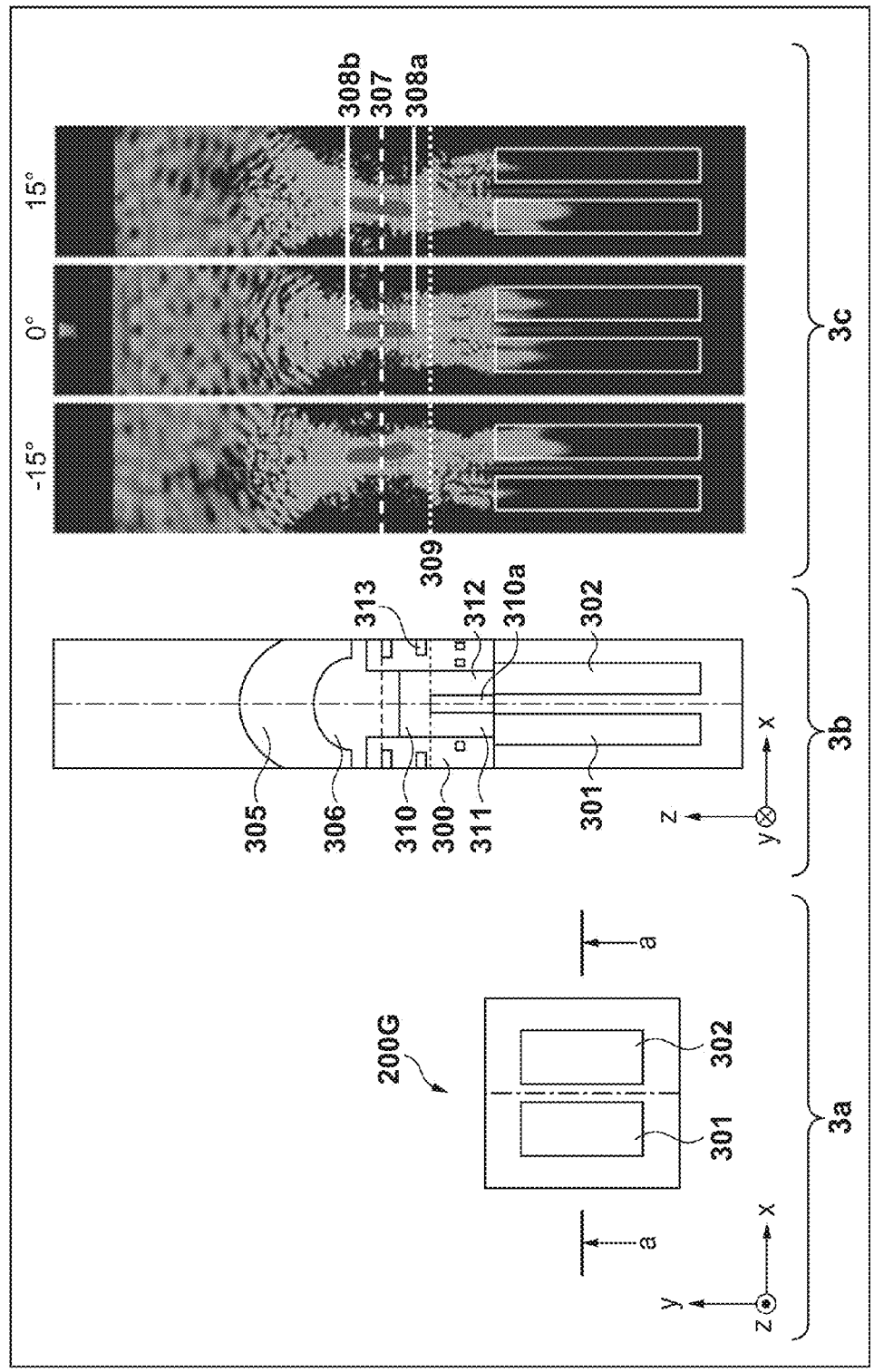
FIG. 3 shows a schematic plan view and schematic sectional view of a pixel in the embodiment of the present invention.

FIG. 3-3a is a plan view of one pixel 200G of the image sensor shown in FIG. 2 when viewed from the light receiving surface side (+z side) of the image sensor. FIG. 3-3b is a sectional view of an a-a section in FIG. 3-3a when viewed from the −y side. FIG. 3-3c shows light energy distributions in the pixel when beams of plane waves enter the pixel according to the embodiment at −15° (left view), 0° (center view), and 15° (right view), respectively.

As shown in FIG. 3, in the pixel 200G of the embodiment, a microlens 305 and intra-layer lens 306 for converging incident light are formed on the light receiving side in each pixel. Photo-electric conversion units 301 and 302 obtained by two-division in the x direction and one-division in the y direction are formed. The photo-electric conversion units 301 and 302 correspond to the sub-pixels 201 and 202, respectively.

The refractive index of the intra-layer lens 306 is set to be higher than that of the microlens 305. If necessary, the intra-layer lens 306 may be omitted.

The photo-electric conversion units 301 and 302 may be photodiodes having a pin structure in which an intrinsic layer is sandwiched between a p-type layer and an n-type layer, or if necessary, may be p-n junction photodiodes by omitting the intrinsic layer.

In each pixel, a color filter (not shown) is formed between the microlens 305 and the intra-layer lens 306. If necessary, the spectral transmittance of the color filter may be changed for each sub-pixel, or the color filter may be omitted.

A first light guide 310 and a plurality of (two) divided second light guides 311 and 312 are formed between a compound microlens formed from the microlens 305 and intra-layer lens 306, and the plurality of (two) divided photo-electric conversion units 301 and 302. The refractive indices of the first and second light guides are higher than that of an insulating layer 300 for insulating interconnections from each other.

In the embodiment, the first light guide 310 is arranged on the side of the microlens 305 (microlens side), and the plurality of (two) divided second light guides 311 and 312 are arranged on the side of the plurality of (two) divided photo-electric conversion units. The division count (division count: 2) of the second light guide is set to be larger than the division count (division count: 1) of the first light guide. That is, the light guide is divided into a plurality of light guides on the side of the plurality of divided photo-electric conversion units. The division count of the photo-electric conversion unit and that of the light guide (second light guide) are desirably the same.

In the embodiment, a focus position 307 of the compound microlens formed from the microlens 305 and intra-layer lens 306 is set to be positioned in the first light guide 310 (in the first light guide).

Light entering the pixel 200G shown in FIG. 3 is converged by the microlens 305, spectrally split by the color filter (not shown), converged again by the intra-layer lens 306, and propagates through the first light guide 310. After the propagation through the first light guide 310, the light propagates through the second light guide 311 and is received by the photo-electric conversion unit 301, or propagates through the second light guide 312 and is received by the photo-electric conversion unit 302, thereby outputting a photo-electrically converted signal.

When incident light enters the pixel at 0° with respect to the optical axis (parallel to the optical axis), as shown in the center view of FIG. 3-3c, the amount of light received by the photo-electric conversion unit 301 after propagation through the second light guide 311, and that of light received by the photo-electric conversion unit 302 after propagation through the second light guide 312 become almost equal. In contrast, when incident light enters the pixel at −15° with respect to the optical axis, as shown in the left view of FIG. 3-3c, the amount of light received by the photo-electric conversion unit 302 after propagation through the second light guide 312 becomes larger. When incident light enters the pixel at 15° with respect to the optical axis, as shown in the right view of FIG. 3-3c, the amount of light received by the photo-electric conversion unit 301 after propagation through the second light guide 311 becomes larger.

In the photo-electric conversion units 301 and 302, electron-hole pairs are generated in accordance with the received light amount and separated in a depletion layer. The negatively charged electrons are accumulated in an n-type layer (not shown), whereas the holes are emitted outside the image sensor through a p-type layer connected to a constant voltage source (not shown).

Figure 4:
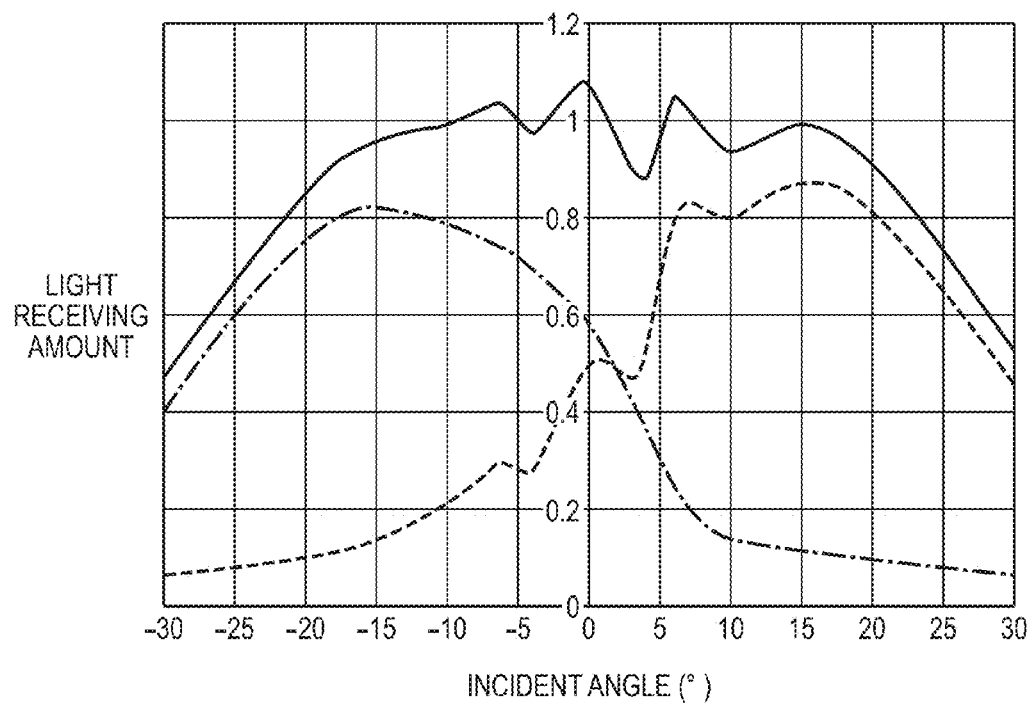
FIG. 4 is a graph exemplifying a pupil intensity distribution in the embodiment of the present invention.

FIG. 4 exemplifies the pupil intensity distribution of the pixel (incident angle dependence of the received light amount) in the embodiment. In FIG. 4, the abscissa represents the incident angle, and the ordinate represents the received light amount. A dotted line indicates an example of the pupil intensity distribution of light received by the photo-electric conversion unit 301. The photo-electric conversion unit 301 receives light incident at a positive incident angle. A chain line indicates an example of the pupil intensity distribution of light received by the photo-electric conversion unit 302. Unlike the photo-electric conversion unit 301, the photo-electric conversion unit 302 receives light incident at a negative incident angle. A solid line indicates an example of the pupil intensity distribution of light received by the entire pixel 200G as a combination of the photo-electric conversion units 301 and 302. According to the embodiment, satisfactory pupil division is performed at positive and negative incident angles.

Comparative Examples 1 and 2 will be described below for comparison with the embodiment.

Figure 5:
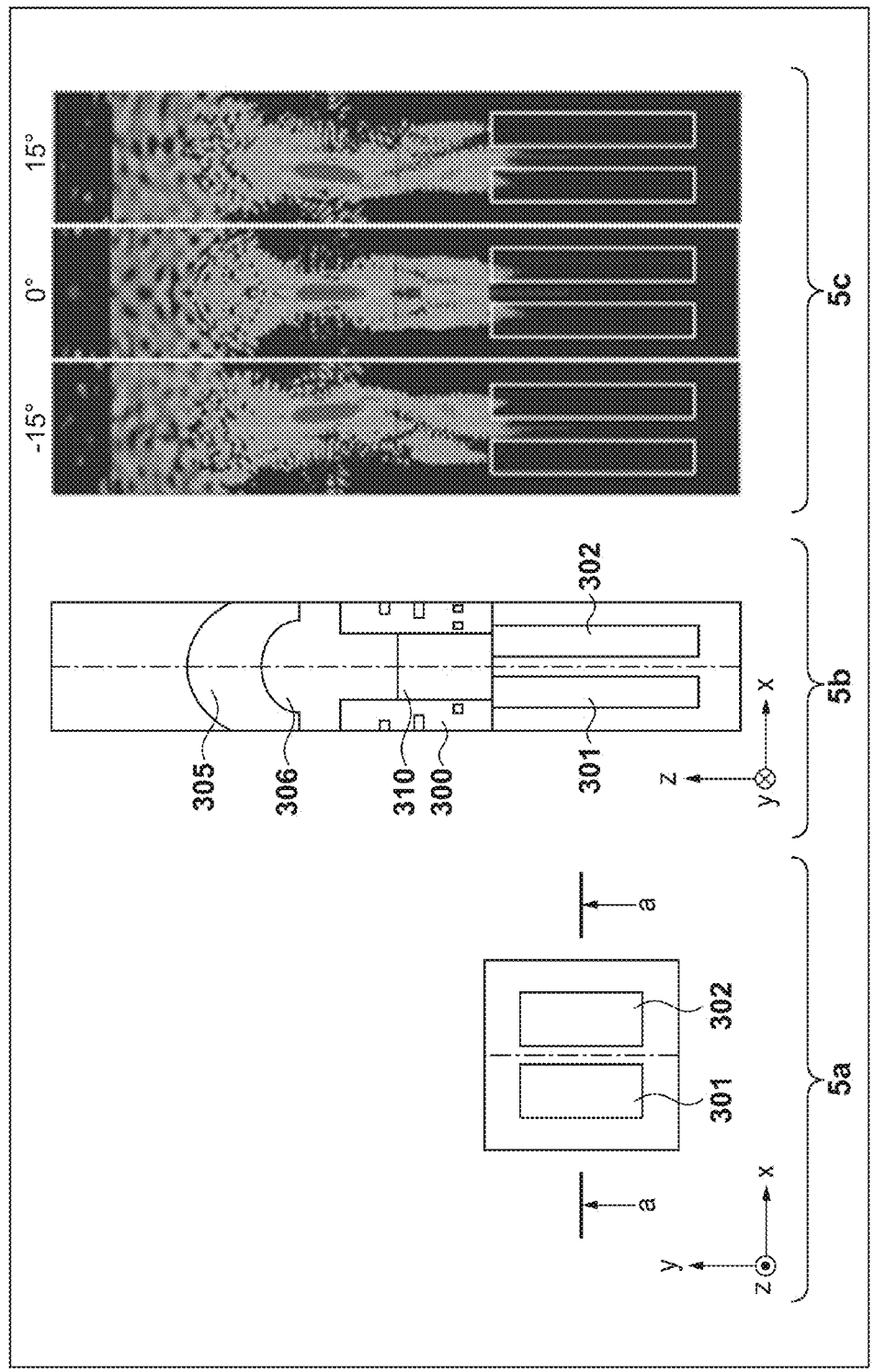
FIG. 5 shows a schematic plan view and schematic sectional view of a pixel in Comparative Example 1 of the present invention.

As Comparative Example 1, FIG. 5 shows a case in which only one first light guide 310 is formed for the plurality of (two) divided photo-electric conversion units 301 and 302. FIG. 5-5a is a plan view of a pixel in Comparative Example 1 when viewed from the light receiving surface side (+z side). FIG. 5-5b is a sectional view of an a-a section in FIG. 5-5a when viewed from the −y side. FIG. 5-5c shows light energy distributions in the pixel when beams of plane waves enter the pixel in Comparative Example 1 at −15° (left view), 0° (center view), and 15° (right view), respectively. In Comparative Example 1, only one first light guide 310 is formed as the light guide. Regardless of the incident angle of light with respect to the pixel, light having propagated through the first light guide 310 enters the light receiving surfaces of the photo-electric conversion units 301 and 302 and is received.

Figure 6:
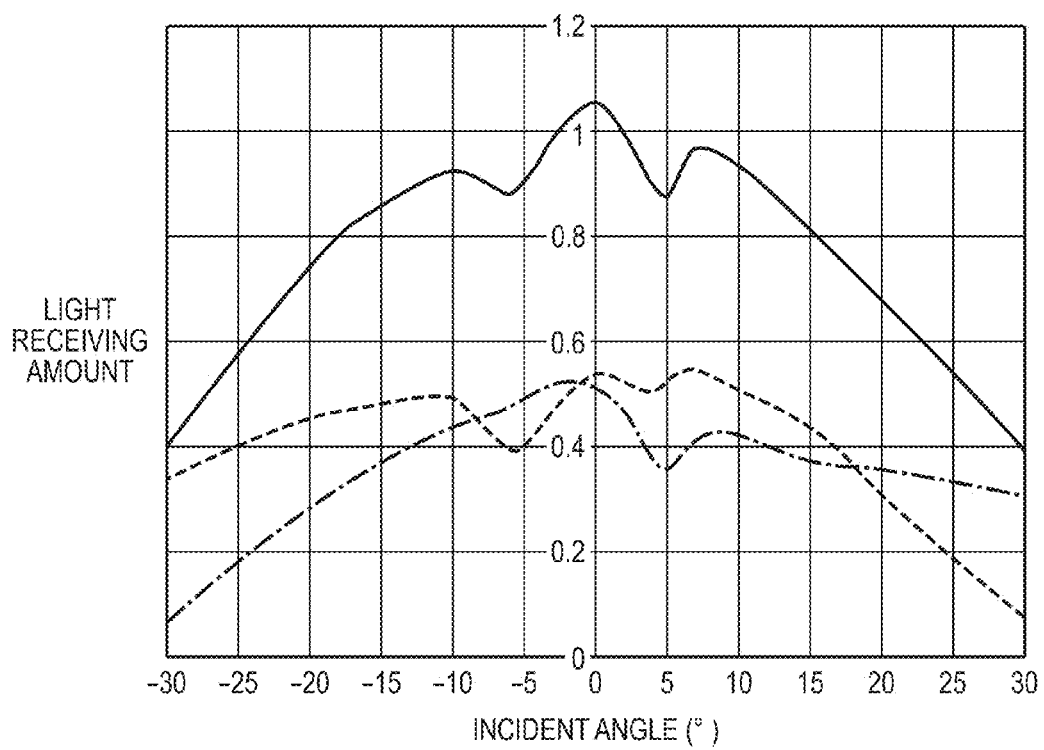
FIG. 6 is a graph exemplifying a pupil intensity distribution in Comparative Example 1 of the present invention.

FIG. 6 exemplifies the pupil intensity distribution of the pixel (incident angle dependence of the received light amount) in Comparative Example 1. In FIG. 6, the abscissa represents the incident angle, and the ordinate represents the received light amount. A dotted line indicates an example of the pupil intensity distribution of light received by the photo-electric conversion unit 301. A chain line indicates an example of the pupil intensity distribution of light received by the photo-electric conversion unit 302. A solid line indicates an example of the pupil intensity distribution of light received by the entire pixel 200G as a combination of the photo-electric conversion units 301 and 302. The pupil intensity distribution (dotted line) of the photo-electric conversion unit 301 and the pupil intensity distribution (chain line) of the photo-electric conversion unit 302 exhibit that both the photo-electric conversion units 301 and 302 receive beams incident at positive and negative incident angles. In Comparative Example 1, therefore, no satisfactory pupil division can be performed at positive and negative incident angles.

Figure 7:
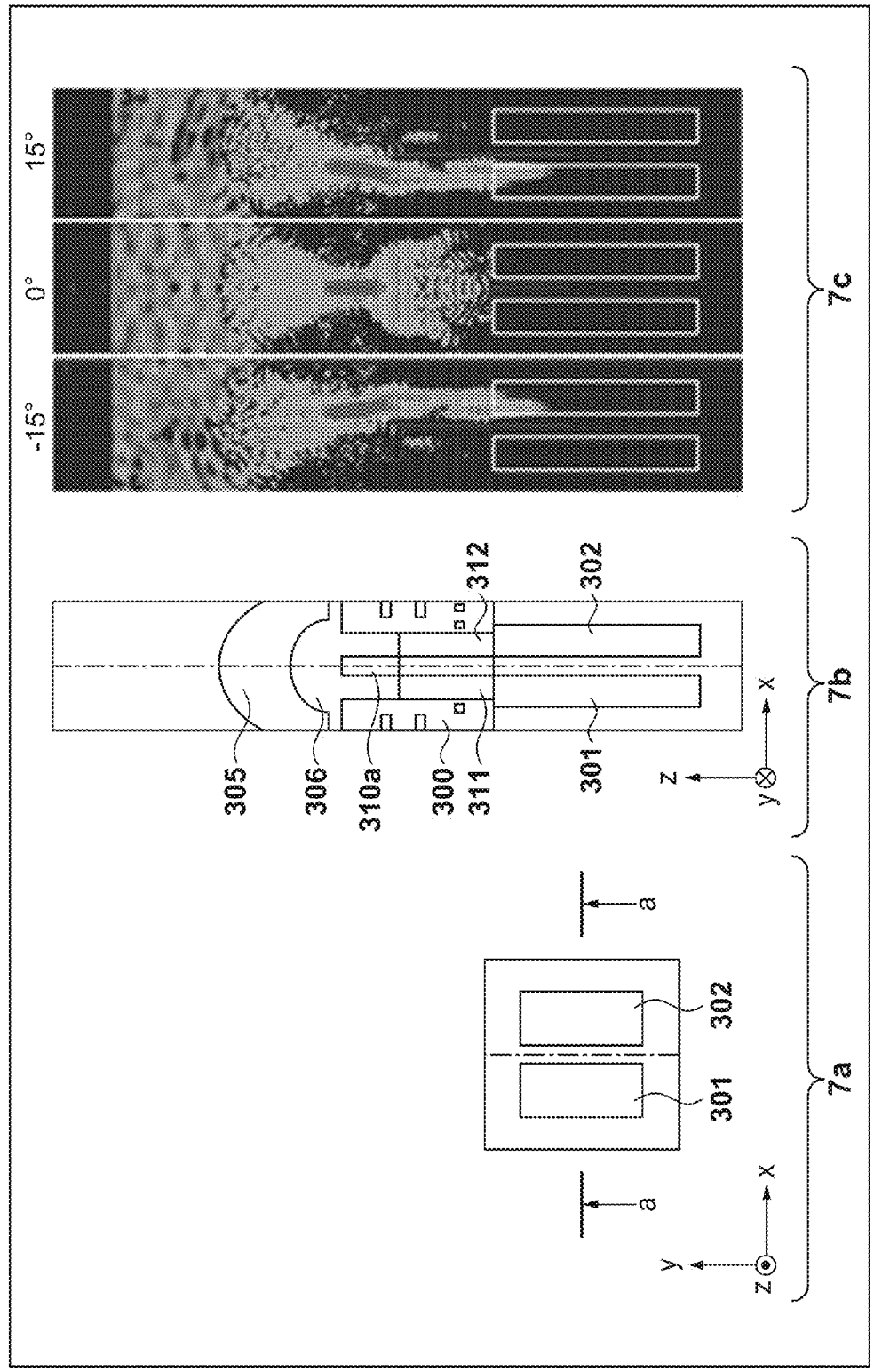
FIG. 7 shows a schematic plan view and schematic sectional view of a pixel in Comparative Example 2 of the present invention.

As Comparative Example 2, FIG. 7 shows a case in which the plurality of (two) divided second light guides 311 and 312 are formed for the plurality of (two) divided photo-electric conversion units 301 and 302 without forming the first light guide. FIG. 7-7a is a plan view of a pixel in Comparative Example 2 when viewed from the light receiving surface side (+z side). FIG. 7-7b is a sectional view of an a-a section in FIG. 7-7a when viewed from the −y side. FIG. 7-7c shows light energy distributions in the pixel when beams of plane waves enter the pixel in Comparative Example 2 at −15° (left view), 0° (center view), and 15° (right view), respectively.

In Comparative Example 2, light entering at a positive incident angle propagates through the second light guide 311 and is received by the photo-electric conversion unit 301. In contrast, light incident at a negative incident angle propagates through the second light guide 312 and is received by the photo-electric conversion unit 302. Hence, pupil division can be performed at positive and negative incident angles. However, light incident at an incident angle of almost 0° is reflected by the upper end of a guide separator 310a, or its traveling direction is changed to an angle at which the light cannot propagate through the light guide. As a result, the amounts of light received by the photo-electric conversion units 301 and 302 decrease.

Figure 8:
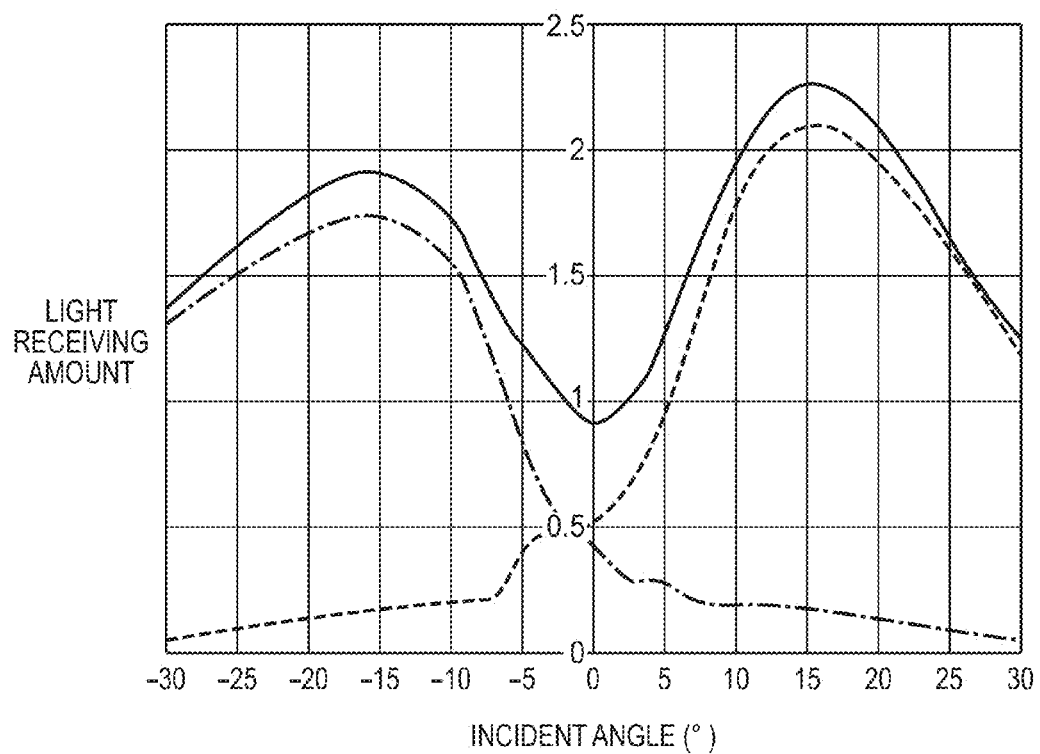
FIG. 8 is a graph exemplifying a pupil intensity distribution in Comparative Example 2 of the present invention.

FIG. 8 exemplifies the pupil intensity distribution of the pixel (incident angle dependence of the received light amount) in Comparative Example 2. In FIG. 8, the abscissa represents the incident angle, and the ordinate represents the received light amount. A dotted line indicates an example of the pupil intensity distribution of light received by the photo-electric conversion unit 301. A chain line indicates an example of the pupil intensity distribution of light received by the photo-electric conversion unit 302. A solid line indicates an example of the pupil intensity distribution of light received by the entire pixel 200G as a combination of the photo-electric conversion units 301 and 302. In Comparative Example 2, pupil division can be performed at positive and negative incident angles. However, the light receiving sensitivity of the entire pixel 200G (image forming pixel) as a combination of the photo-electric conversion units 301 and 302 decreases near the incident angle of 0°. For this reason, pupil division cannot be performed while keeping good performance of the image forming pixel.

In the embodiment, as shown in FIG. 3, the first light guide 310 and the plurality of (two) divided second light guides 311 and 312 are formed, and the focus position 307 of the microlens is set to be positioned in the first light guide 310. In the embodiment, light entering at an incident angle of almost 0° is converged once in the first light guide 310, spreads again, propagates through the second light guides 311 and 312, and is received by the photo-electric conversion units 301 and 302. While somewhat spreading, a light spot converged by the microlens enters the light receiving surfaces at the upper ends of the second light guides 311 and 312. Thus, the influence of the upper end of the guide separator 310a can be suppressed, and the amounts of light received by the photo-electric conversion units 301 and 302 can be kept satisfactorily. Light entering at a positive incident angle is converged in the first light guide 310, enters the light receiving surface at the upper end of the second light guide 311, then propagates through the second light guide 311, and is received by the photo-electric conversion unit 301. To the contrary, light entering at a negative incident angle is converged in the first light guide 310, enters the light receiving surface at the upper end of the second light guide 312, then propagates through the second light guide 312, and is received by the photo-electric conversion unit 302. According to the embodiment, as shown in FIG. 4, satisfactory pupil division can be performed in the pixel in which the light guide is formed.

Each of a range from the focus position 307 to 308a and a range from the focus position 307 to 308b with respect to the focus position 307 of the microlens serving as the center is a range of the one-side focal depth of the microlens. A light spot converged by the microlens starts spreading outside the range of the focal depth. While somewhat spreading, the light spot converged by the microlens enters the light receiving surfaces at the upper ends of the second light guides 311 and 312. Therefore, the distance between the focus position 307 of the microlens and the second light guide is desirably set to be equal to or larger than the one-side focal depth of the microlens.

When forming the first and second light guides by photolithography and etching, part of an interconnection layer 313 is left in conformity with the shape of the separator 310a, and used as a mask for protection from etching, thereby easily forming a plurality of divided second light guides. To simplify the second light guide formation process, the upper end of the second light guide is desirably formed within the range of the width of the interconnection layer 313.

Figure 9:
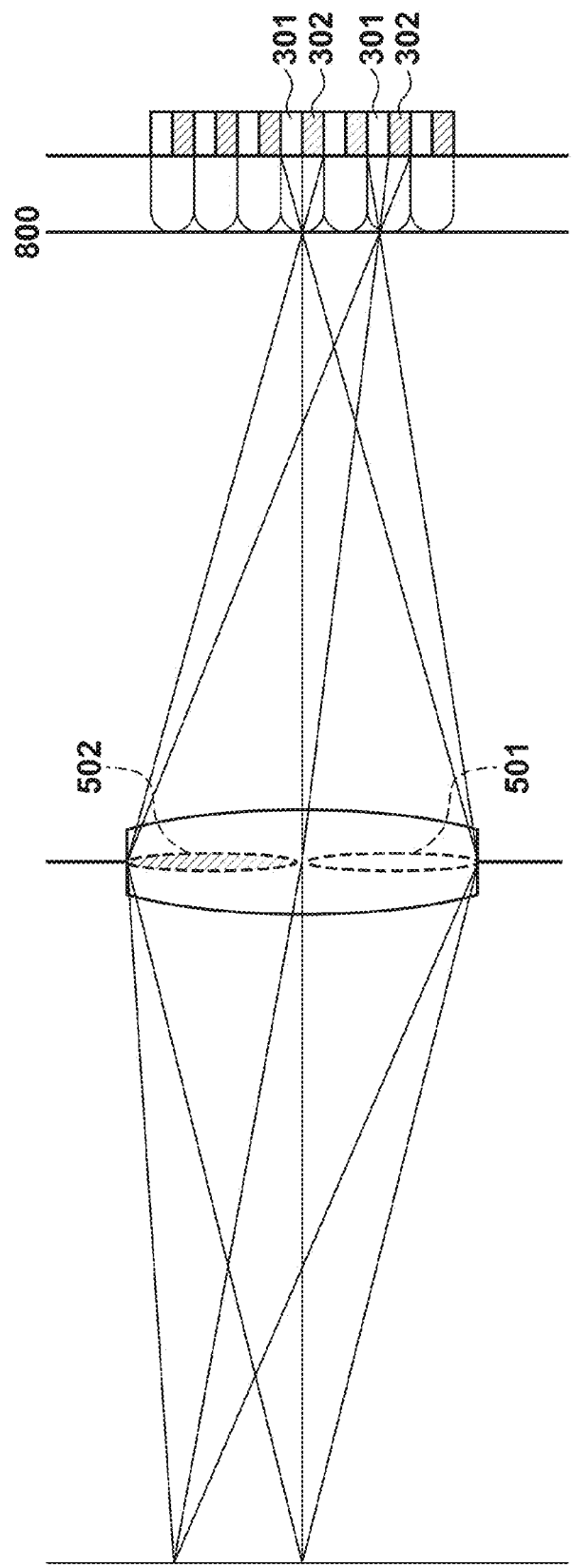
FIG. 9 is a schematic view for explaining an image sensor and pupil division in the embodiment of the present invention.

FIG. 9 is a schematic view showing the correspondence between the image sensor and pupil division in the embodiment. The photo-electric conversion units 301 and 302 (sub-pixels 201 and 202) obtained by 2×1 division for each pixel of the image sensor receive beams having passed through different partial pupil areas in partial pupil areas 501 and 502, respectively.

Signals of specific sub-pixels are selected from the sub-pixels 201 and 202 (photo-electric conversion units 301 and 302) for respective pixels. As a result, parallax images corresponding to specific partial pupil areas in the partial pupil areas 501 and 502 of the imaging optical system can be obtained. For example, by selecting signals of the sub-pixels 201 (photo-electric conversion units 301) for respective pixels, a parallax image having a resolution of an effective pixel count corresponding to the partial pupil area 501 of the imaging optical system can be obtained. This also applies to the sub-pixel 202.

Adding all signals of the sub-pixels 201 and 202 in respective pixels can generate a captured image having a resolution of an effective pixel count.

Figure 10:
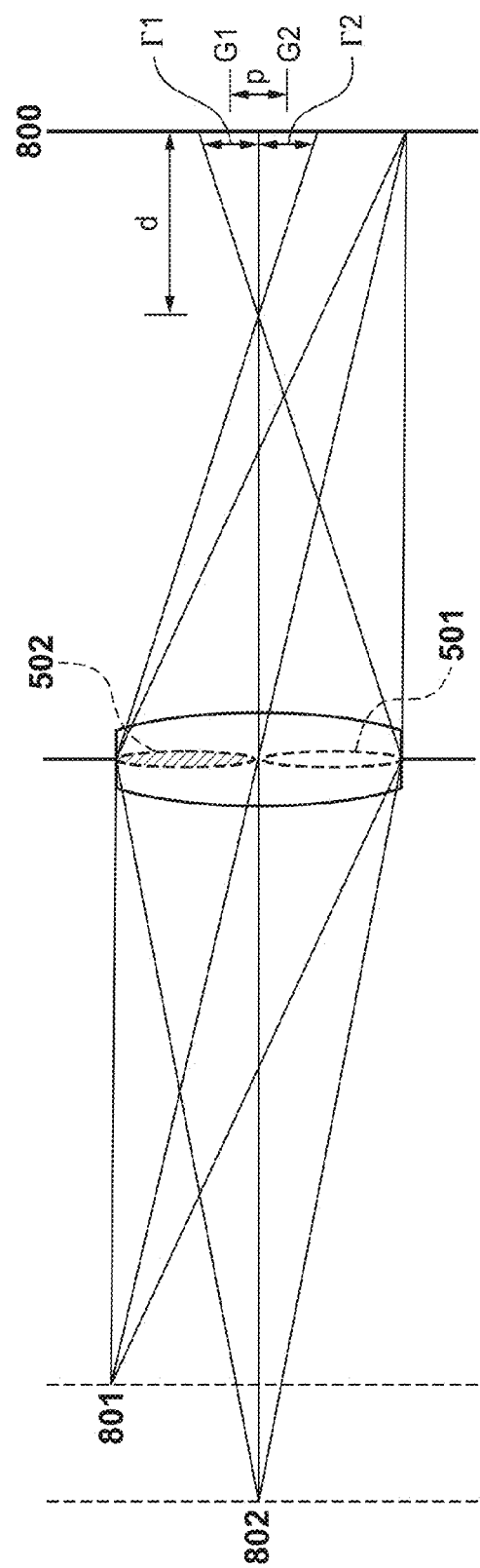
FIG. 10 is a view showing the schematic relationship between the image shift amount and the defocus amount in the embodiment of the present invention.

The relationship between the image shift amount between parallax images, and the defocus amount in the present invention will be explained. FIG. 10 is a view showing the schematic relationship between the image shift amount between parallax images, and the defocus amount. The image sensor (not shown) according to the embodiment is arranged on an imaging plane 800. Similar to FIG. 9, the exit pupil of the imaging optical system is divided into the two, partial pupil areas 501 and 502.

As for a defocus amount d, the distance from the imaging position of an object to the imaging plane is defined as a magnitude |d|. A front-focus state in which the imaging position of the object is on the object side with respect to the imaging plane is defined as a negative sign (d<0). A rear-focus state in which the imaging position of the object is on a side opposite to the object with respect to the imaging plane is defined as a positive sign (d>0). An in-focus state in which the imaging position of the object is on the imaging plane is represented as d=0. In FIG. 10, an object 801 represents an example of the in-focus state (d=0), and an object 802 represents an example of the front-focus state (d<0). A defocus state (|d|>0) includes both the front-focus state (d<0) and the rear-focus state (d>0).

In the front-focus state (d<0), a beam having passed through the partial pupil area 501 (502) out of beams traveling from the object 802 is converged once and then spreads to a width Γ1 (Γ2) centered on a barycentric position G1 (G2) of the beam, forming a blurred image on the imaging plane 800. The blurred image is received by the sub-pixel 201 (202) forming each pixel arrayed in the image sensor, generating a parallax image. The parallax image generated from a signal from the sub-pixel 201 (202) is recorded as an object image in which the object 802 is blurred with the width Γ1 (Γ2) at the barycentric position G1 (G2). As the magnitude |d| of the defocus amount d increases, the blur width Γ1 (Γ2) of the object image increases almost proportionally. Similarly, as the magnitude |d| of the defocus amount d increases, a magnitude |p| of an image shift amount p (=G1−G2) of the object image between parallax images increases almost proportionally. This also applies to the rear-focus state (d>0) though the image shift direction of the object image between parallax images is opposite to that for the front-focus state. In the in-focus state (d=0), the barycentric positions of object images between parallax images are coincident (p=0), and no image shift occurs.

From this, as the magnitudes of the defocus amounts of two (plurality of) parallax images in the embodiment increase, the magnitude of the image shift amount between the plurality of parallax images increases. In the embodiment, the magnitude of the image shift amount between two parallax images increases along with an increase in the magnitude of the defocus amount. Based on this relationship, the image shift amount between parallax images is calculated by correlation calculation, and focus detection is performed by the imaging plane phase-difference detection method using a focus detection signal.

With this arrangement, satisfactory pupil division can be performed by a pixel in which the light guide is formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2012-232333, filed Oct. 19, 2012, and 2013-169927, filed Aug. 19, 2013 which are hereby incorporated by reference herein in their entirety.

What is claimed is:

1. An image capturing apparatus comprising an image sensor including a plurality of image forming pixels which detect an object image formed by an imaging optical system and generate a captured image, and a lens which is arranged for the plurality of image forming pixels and converges incident light to the image forming pixels, wherein each of the image forming pixels includes a plurality of divided photo-electric conversion units, the plurality of photo-electric conversion units have a function of photo-electrically converting a plurality of images having passed through different exit pupils of the imaging optical system, and outputting focus detection signals for performing focus adjustment by a phase-difference detection method, each of the image forming pixels includes a first light guide and a second light guide between the lens and the plurality of divided photo-electric conversion units, the first light guide is arranged on a side of the lens, and the second light guide is arranged on a side of the photo-electric conversion unit, a division count of the second light guide is larger than the division count of the first light guide, and a distance between a convergence position of the lens and upper ends of the second light guides is set to be equal to or larger than a one-side focal depth of the lens so that light which passed through the lens enters at the upper ends of the second light guides while the light is spreading.

2. The apparatus according to claim 1, wherein the convergence position of the lens is set in the first light guide.

3. The apparatus according to claim 1, wherein an interconnection layer is interposed between the lens and the photo-electric conversion unit, and the upper end of the second light guide in an optical axis direction of the imaging optical system is positioned within a range of a width of the interconnection layer.

4. An image sensor comprising a plurality of image forming pixels each including a lens and a plurality of divided photo-electric conversion units, wherein each of said image forming pixels includes a first light guide and a second light guide between the lens and the plurality of divided photo-electric conversion units, the first light guide is arranged on a side of the lens, the second light guide is arranged on a side of the photo-electric conversion unit, a division count of the second light guide is larger than the division count of the first light guide, and a distance between a convergence position of the lens and upper ends of the second light guides is set to be equal to or larger than a one-side focal depth of the lens so that light which passed through the lens enters at the upper ends of the second light guides while the light is spreading.

5. The sensor according to claim 4, wherein the convergence position of the lens is set in the first light guide.

6. The sensor according to claim 4, wherein an interconnection layer is interposed between the lens and the photo-electric conversion unit, and the upper end of the second light guide in an optical axis direction is positioned within a range of a width of the interconnection layer.

* * * * *